(12) United States Patent
Jeon et al.

(10) Patent No.: US 11,678,547 B2
(45) Date of Patent: Jun. 13, 2023

(54) DISPLAY DEVICE AND METHOD OF MANUFACTURING THE SAME

(71) Applicant: SAMSUNG DISPLAY CO., LTD., Yongin-si (KR)

(72) Inventors: Kyungjin Jeon, Yongin-si (KR); Joonseok Park, Yongin-si (KR); Soyoung Koo, Yongin-si (KR); Myounghwa Kim, Yongin-si (KR); Eoksu Kim, Yongin-si (KR); Taesang Kim, Yongin-si (KR); Hyungjun Kim, Yongin-si (KR); Yeonkeon Moon, Yongin-si (KR); Geunchul Park, Yongin-si (KR); Sangwoo Sohn, Yongin-si (KR); Junhyung Lim, Yongin-si (KR); Hyelim Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 85 days.

(21) Appl. No.: 17/328,026

(22) Filed: May 24, 2021

(65) Prior Publication Data

US 2021/0280667 A1    Sep. 9, 2021

Related U.S. Application Data

(62) Division of application No. 16/804,152, filed on Feb. 28, 2020, now Pat. No. 11,049,929.

(30) Foreign Application Priority Data

Jun. 14, 2019   (KR) .................. 10-2019-0071070

(51) Int. Cl.
*H01L 27/32* (2006.01)
*H01L 29/78* (2006.01)
(Continued)

(52) U.S. Cl.
CPC ...... *H01L 27/3279* (2013.01); *H01L 27/3248* (2013.01); *H01L 27/3258* (2013.01);
(Continued)

(58) Field of Classification Search
CPC ..... H01L 27/32; H01L 27/324; H01L 27/325; H01L 27/326; H01L 27/327;
(Continued)

(56) References Cited

U.S. PATENT DOCUMENTS

2016/0056225 A1   2/2016   Lee et al.
2016/0079330 A1   3/2016   Oh et al.
(Continued)

FOREIGN PATENT DOCUMENTS

EP        3029733 A      6/2016
KR   1020170078075 A    7/2017
(Continued)

OTHER PUBLICATIONS

Extended European Search Report for Application No. 20165819.2, dated Oct. 5, 2020, citing the above reference(s).

*Primary Examiner* — Fazli Erdem
(74) *Attorney, Agent, or Firm* — Cantor Colburn LLP

(57) ABSTRACT

A display device includes: a substrate; a first thin film transistor and a second thin film transistor arranged over the substrate; a display element connected to the first thin film transistor; a wiring connected to the second thin film transistor and including a first wiring layer and a second wiring layer; a pattern insulating layer arranged between the first wiring layer and the second wiring layer; a planarization layer covering the wiring; and a connection electrode arranged on the planarization layer and connected to the first wiring layer and the second wiring layer respectively through a first contact hole and a second contact hole.

8 Claims, 14 Drawing Sheets

(51) Int. Cl.
*H01L 51/52* (2006.01)
*H01L 51/56* (2006.01)
*H01L 27/12* (2006.01)
*H01L 49/02* (2006.01)

(52) U.S. Cl.
CPC ........ *H01L 27/3265* (2013.01); *H01L 51/524* (2013.01); *H01L 51/5253* (2013.01); *H01L 51/56* (2013.01); *H01L 27/124* (2013.01); *H01L 27/1248* (2013.01); *H01L 27/1255* (2013.01); *H01L 27/1288* (2013.01); *H01L 28/60* (2013.01); *H01L 2227/323* (2013.01)

(58) Field of Classification Search
CPC ............. H01L 27/3248; H01L 27/3258; H01L 27/3265; H01L 27/3279; H01L 51/52; H01L 51/56; H01L 51/524; H01L 51/525; H01L 51/5253; H01L 29/78; H01L 29/786; H01L 29/78633

USPC ......................................................... 257/40
See application file for complete search history.

(56) References Cited

U.S. PATENT DOCUMENTS

2016/0322449 A1 11/2016 Pyon
2017/0345882 A1\* 11/2017 Nam .................... H01L 27/3258
2018/0122888 A1 5/2018 Jung et al.

FOREIGN PATENT DOCUMENTS

| KR | 1020180003363 A | 1/2018 |
| KR | 1020180024909 A | 3/2018 |
| KR | 1020180047540 A | 5/2018 |
| KR | 101947007 B1 | 2/2019 |

\* cited by examiner

DISPLAY DEVICE AND METHOD OF MANUFACTURING THE SAME

This application is a divisional of U.S. patent application Ser. No. 16/804,152, filed on Feb. 28, 2020, which claims priority to Korean Patent Application No. 10-2019-0071070, filed on Jun. 14, 2019, and all the benefits accruing therefrom under 35 U.S.C. § 119, the content of which in its entirety is herein incorporated by reference.

BACKGROUND

1. Field

One or more embodiments relate to a display device and a method of manufacturing the display device.

2. Description of Related Art

A display device is an apparatus that visually displays an image of data. The display device typically includes a substrate divided into a display area and a non-display area. In such a display device, a gate line and a data line may be arranged in the display area and insulated from each other. The gate line and the data line may intersect with each other to define a plurality of pixels in the display area. Also, a thin film transistor and a pixel electrode may be provided to each pixel area in the display area, and the pixel electrode may be electrically connected to the thin film transistor. Also, an opposite electrode may be provided in the display area, and the opposite electrode may be provided in the pixel areas in common. Various wirings, a gate driver, a data driver, a controller, etc. for transferring an electric signal to the display area may be provided in the non-display area.

SUMMARY

One or more embodiments include a display device that displays an image with improved quality. However, it should be understood that embodiments described herein should be considered in a descriptive sense only and not for limitation of the disclosure.

According to an embodiment, a display device includes a substrate, a first thin film transistor disposed over the substrate, a second thin film transistor disposed over the substrate, a display element connected to the first thin film transistor, a wiring connected to the second thin film transistor, where the wiring includes a first wiring layer and a second wiring layer, a pattern insulating layer disposed between the first wiring layer and the second wiring layer, a planarization layer covering the wiring, and a connection electrode disposed on the planarization layer and connected to the first wiring layer and the second wiring layer through a first contact hole and a second contact hole, respectively.

In an embodiment, a bottom surface of the second wiring layer may have a same area as an area of a top surface of the pattern insulating layer.

In an embodiment, a lateral surface of the second wiring layer may be connected to a lateral surface of the pattern insulating layer.

In an embodiment, the display element may include a pixel electrode, an emission layer, and an opposite electrode, and the connection electrode may include a same material as a material of the pixel electrode and be disposed in a same layer as the pixel electrode.

In an embodiment, an area of the first wiring layer may be different from an area of the second wiring layer.

In an embodiment, the planarization layer may contact a lateral surface of the pattern insulating layer.

In an embodiment, the display device may further include a capacitor including a first electrode and a second electrode, where the first electrode may include a same material as a material of a gate electrode of the first thin film transistor, and the second electrode may overlap the first electrode, include a same material as a material of the first wiring layer, and may be disposed in a same layer as the first wiring layer.

In an embodiment, the display device may further include a bias electrode disposed below the first thin film transistor.

In an embodiment, the bias electrode may be connected to a source electrode or a drain electrode of the first thin film transistor.

In an embodiment, the wiring may include a data line providing a data signal to the second thin film transistor.

In an embodiment, the display device may further include a thin-film encapsulation layer covering the display element, where the thin-film encapsulation layer may include a first inorganic encapsulation layer, an organic encapsulation layer, and a second inorganic encapsulation layer, which are stacked one on another.

In an embodiment, the display device may further include a sealing substrate disposed opposite to the substrate.

According to an embodiment, a method of manufacturing a display device includes providing a thin film transistor and a first wiring layer connected to the thin film transistor over a substrate, sequentially providing an insulating layer and a conductive layer on an entire top surface of the substrate to cover the first wiring layer, providing a photoresist pattern on the conductive layer, forming a second wiring layer and a pattern insulating layer by etching the conductive layer and the insulating layer using the photoresist pattern as an etch mask, and providing a connection electrode connecting the first wiring layer and the second wiring layer.

In an embodiment, a bottom surface of the second wiring layer may have a same area as an area of a top surface of the pattern insulating layer.

In an embodiment, a lateral surface of the second wiring layer may be connected to a lateral surface of the pattern insulating layer.

In an embodiment, a display element of the display device may include a pixel electrode, an emission layer and an opposite electrode, and the connection electrode may include a same material as a material of the pixel electrode and be disposed in a same layer as the pixel electrode.

In an embodiment, an area of the first wiring layer may be different from an area of the second wiring layer.

In an embodiment, the method may further include providing a planarization layer covering the first wiring layer, the second wiring layer and the pattern insulating layer before the providing the connection electrode.

In an embodiment, the method may further include providing a capacitor, where the capacitor may include a first electrode and a second electrode, the first electrode may include a same material as a material of a gate electrode of the thin film transistor, and the second electrode may overlap the first electrode, may include a same material as a material of the first wiring layer, and may be disposed in a same layer as the first wiring layer.

In an embodiment, the method may further include a bias electrode disposed below the thin film transistor.

BRIEF DESCRIPTION OF THE DRAWINGS

The above and other features of embodiments of the disclosure will be more apparent from the following description taken in conjunction with the accompanying drawings, in which.

DETAILED DESCRIPTION

Figure 1:
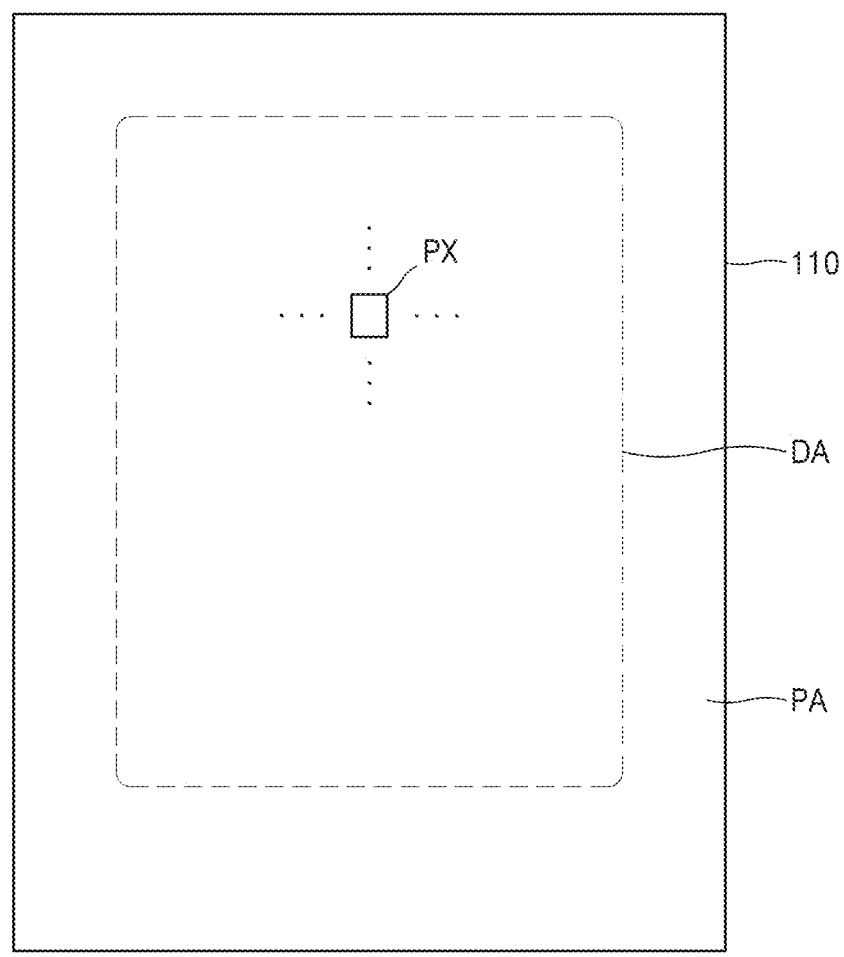
FIG. 1 is a plan view of a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

It will be understood that when a layer, region, or component is referred to as being "on" another layer, region, or component, it can be directly or indirectly on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "connected to or electrically connected" to another layer, region, or component, it may be "directly electrically connected" to the other layer, region, or component or may be "indirectly connected or electrically connected" to other layer, region, or component with other layer, region, or component interposed therebetween.

Herein, a display device is an apparatus that displays an image and may include a liquid crystal display, an electrophoretic display, an organic light-emitting display, an inorganic light-emitting display, a field emission display, a surface-conduction electron-emitter display, a plasma display, and a cathode ray display.

For convenience of description, embodiments where a display device is an organic light-emitting display device will hereinafter be described in detail, but embodiments of a display device according to the disclosure is not limited thereto and may be variously modified to be one of other types of display device.

Hereinafter, embodiments of the invention will be described in detail with reference to the accompanying drawings.

FIG. 1 is a plan view of a display device according to an embodiment.

Referring to FIG. 1, an embodiment of the display device includes a display area DA and a peripheral area PA, which is a non-display area surrounding the display area. Pixels PX including a display element are arranged in the display area DA and provide a predetermined image.

In an embodiment, each pixel PX emits, for example, red, green, blue or white light, and may include, for example, an organic light-emitting diode. In such an embodiment, each pixel PX may further include a device such as a thin film transistor TFT and a capacitor.

Herein, a pixel PX represents a sub-pixel that emits one of red, green, blue, and white light as described above.

The peripheral area PA is an area that does not provide an image and includes a scan driver, a data driver and power lines. In such an embodiment, the scan driver and the data driver provide an electric signal to be applied to pixels PX in the display area DA, and the power lines provides power such as a driving voltage and a common voltage.

Figure 2A:
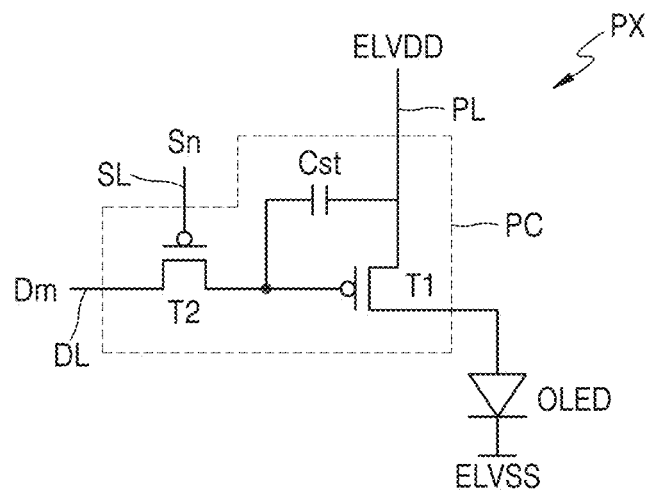
FIGS. 2A to 2C are equivalent circuit diagrams of one of the pixels of a display device according to embodiments.
Figure 2B:
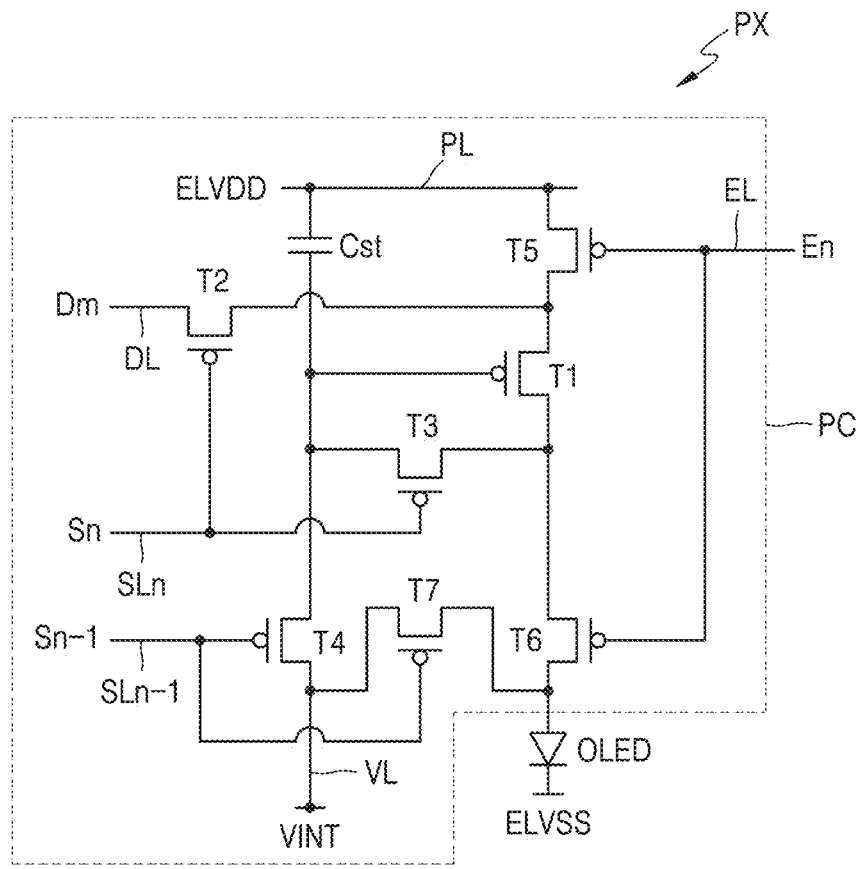
Figure 2C:
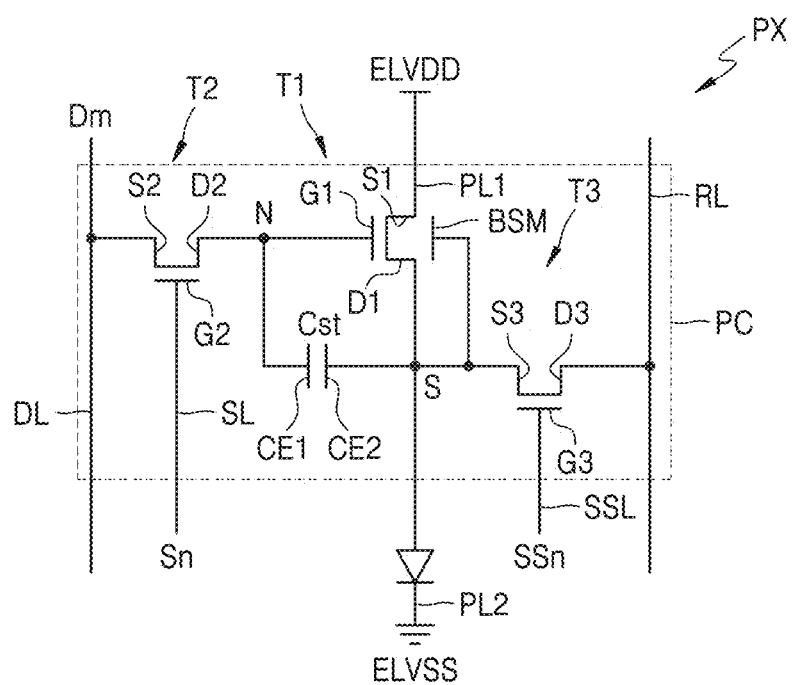

FIGS. 2A to 2C are equivalent circuit diagrams of one of the pixels of a display device according to embodiments.

Referring to FIG. 2A, in an embodiment, each pixel PX includes a pixel circuit PC and an organic light-emitting diode OLED, the pixel circuit PC connected to a scan line SL and a data line DL, and the organic light-emitting diode OLED connected to the pixel circuit PC.

The pixel circuit PC includes a driving thin film transistor T1, a switching thin film transistor T2, and a storage capacitor Cst. The switching thin film transistor T2 is connected to the scan line SL and the data line DL, and transfers a data signal Dm input to the data line DL to the driving thin film transistor T1 in response to a scan signal Sn input to the scan line SL.

The storage capacitor Cst is connected to the switching thin film transistor T2 and the driving voltage line PL and stores a voltage corresponding to a difference between a voltage transferred from the switching thin film transistor T2 and a first power voltage ELVDD (or a driving power voltage) supplied to the driving voltage line PL.

The first thin film transistor T1 may be connected to the driving voltage line PL and the storage capacitor Cst and may control a driving current flowing through the organic light-emitting diode OLED from the driving voltage line PL in response to the voltage stored in the storage capacitor Cst. The organic light-emitting diode OLED may emit light having a predetermined brightness corresponding to the driving current.

FIG. 2A shows an embodiment where the pixel circuit PC includes two thin film transistors and a single storage capacitor, but embodiments are not limited thereto.

Referring to FIG. 2B, in an alternative embodiment, the pixel circuit PC may include the driving thin film transistor T1, the switching thin film transistor T2, a compensation thin film transistor T3, a first initialization thin film transistor T4, an operation control thin film transistor T5, an emission control thin film transistor T6, and a second thin film transistor T7.

FIG. 2B shows an embodiment where each pixel PX includes signal lines SLn, SLn-1, EL, and DL, an initialization voltage line VL, and the driving voltage line PL, but embodiments are not limited thereto. In another alternative embodiment, at least one of the signal lines SLn, SLn-1, EL, and DL, and the initialization voltage line VL may be shared by a neighboring pixel.

A drain electrode of the driving thin film transistor T1 is electrically connected to an organic light-emitting diode OLED through the emission control thin film transistor T6. The driving thin film transistor T1 receives a data signal Dm based on a switching operation of the switching thin film transistor T2 and supplies a driving current to the organic light-emitting diode OLED.

A gate electrode of the switching thin film transistor T2 is connected to the scan line SLn, and a source electrode of the switching thin film transistor T2 is connected to the data line DL. A drain electrode of the switching thin film transistor T2 is connected to the source electrode of the driving thin film transistor T1 and also connected to the driving voltage line PL through the operation control thin film transistor T5.

The switching thin film transistor T2 is turned on in response to a scan signal Sn transferred through the scan line SLn and performs a switching operation of transferring a data signal Dm transferred through the data line DL to the source electrode of the driving thin film transistor T1.

A gate electrode of the compensation thin film transistor T3 may be connected to the scan line SLn. A source electrode of the compensation thin film transistor T3 is connected to the drain electrode of the driving thin film transistor T1 and also connected to the pixel electrode of the organic light-emitting diode OLED through the emission control thin film transistor T6. A drain electrode of the compensation thin film transistor T3 is connected to one of the electrodes of the storage capacitor Cst, a source electrode of the first initialization thin film transistor T4, and the gate electrode of the driving thin film transistor T1. The compensation thin film transistor T3 is turned on in response to a scan signal Sn transferred through the scan line SLn and diode-connects the driving thin film transistor T1 by connecting the gate electrode to the drain electrode of the driving thin film transistor T1.

A gate electrode of the first initialization thin film transistor T4 is connected to a previous scan line SLn-1. A drain electrode of the first initialization thin film transistor T4 may be connected to the initialization voltage line VL. A source electrode of the first initialization thin film transistor T4 may be connected to one of the electrodes of the storage capacitor Cst, the drain electrode of the compensation thin film transistor T3, and the gate electrode of the driving thin film transistor T1. The first initialization thin film transistor T4 is turned on in response to a previous scan signal Sn-1 transferred through the previous scan line SLn-1 and performs an initialization operation of transferring an initialization voltage VINT to the gate electrode of the driving thin film transistor T1, thereby initializing a voltage of the gate electrode of the driving thin film transistor T1.

A gate electrode of the operation control thin film transistor T5 may be connected to the emission control line EL. A source electrode of the operation control thin film transistor T5 may be connected to the driving voltage line PL. A drain electrode of the operation control thin film transistor T5 is connected to the source electrode of the driving thin film transistor T1 and the drain electrode of the switching thin film transistor T2.

A gate electrode of the emission control thin film transistor T6 may be connected to the emission control line EL. A source electrode of the emission control thin film transistor T6 may be connected to the drain electrode of the driving thin film transistor T1 and the source electrode of the compensation thin film transistor T3. A drain electrode of the emission control thin film transistor T6 may be electrically connected to the pixel electrode of the organic light-emitting diode OLED. The operation control thin film transistor T5 and the emission control thin film transistor T6 are simultaneously turned on in response to an emission control signal En transferred through the emission control line EL, and the first power voltage ELVDD is transferred to the organic light-emitting diode OLED and the driving current flows through the organic light-emitting diode OLED.

A gate electrode of the second initialization thin film transistor T7 may be connected to the previous scan line SLn-1. A source electrode of the second initialization thin film transistor T7 may be connected to the pixel electrode of the organic light-emitting diode OLED. A drain electrode of the second initialization thin film transistor T7 may be connected to the initialization voltage line VL. The second initialization thin film transistor T7 is turned on in response to a previous scan signal Sn-1 transferred through the previous scan line SLn-1 and may initialize the pixel electrode of the organic light-emitting diode OLED.

FIG. 2B shows an embodiment where the first initialization thin film transistor T4 and the second initialization thin film transistor T7 are connected to the previous scan line SLn-1, but embodiments are not limited thereto. In another alternative embodiment, the first initialization thin film transistor T4 may be connected to the previous scan line SLn-1 and driven in response to a previous scan signal Sn-1, and the second initialization thin film transistor T7 may be connected to a separate signal line (for example, the next scan line) and driven in response to a signal transferred through the relevant scan line.

The other electrode of the storage capacitor Cst may be connected to the driving voltage line PL. One of the electrodes of the storage capacitor Cst may be connected to the gate electrode of the driving thin film transistor T1, the drain electrode of the compensation thin film transistor T3, and the source electrode of the first initialization thin film transistor T4.

An opposite electrode (e.g. a cathode) of the organic light-emitting diode OLED receives a second power voltage ELVSS (or a common power voltage). The organic light-emitting diode OLED receives the driving current from the driving thin film transistor T1, thereby emitting light.

The pixel circuit PC is not limited to the number of thin film transistors, the number of storage capacitors, and the circuit design described with reference to FIGS. 2A and 2B. The number of the thin film transistors, the number of the storage capacitors, and the circuit design may be variously modified. Though not shown in the pixel circuit PC, a bias electrode may be further provided, and the bias electrode may be arranged below the thin film transistors and connected to a thin film transistor.

Referring to FIG. 2C, in another alternative embodiment, each pixel PX may include an organic light-emitting diode OLED, and the pixel circuit PC including a plurality of thin film transistors that drive the organic light-emitting diode OLED. The pixel circuit PC may include the driving thin film transistor T1, the switching thin film transistor T2, the sensing thin film transistor T3, and the storage capacitor Cst.

A scan line SL is connected to a gate electrode G2 of the switching thin film transistor T2, the data line DL is connected to a source electrode S2 of the switching thin film transistor T2, and a first electrode CE1 of the storage capacitor Cst may be connected to a drain electrode D2 of the switching thin film transistor T2.

Therefore, the switching thin film transistor T2 supplies a data voltage of the data line DL to a first node N in response to a scan signal Sn from the scan line SL of each pixel PX.

A gate electrode G1 of the driving thin film transistor T1 may be connected to the first node N, a source electrode S1 of the driving thin film transistor T1 may be connected to a first power line PL1 for transferring the driving power voltage ELVDD, and a drain electrode D1 may be connected to an anode electrode of the organic light-emitting diode OLED.

In such an embodiment, the driving thin film transistor T1 may adjust the amount of current flowing through the organic light-emitting diode OLED based on a gate-source voltage Vgs of the driving thin film transistor T1 itself, that is, a voltage applied between the driving power voltage ELVDD and the first node N.

A sensing control line SSL is connected to a gate electrode G3 of the sensing thin film transistor T3, a source electrode S3 of the sensing thin film transistor T3 is connected to a second node S, and a drain electrode D3 of the sensing thin film transistor T3 is connected to a reference voltage line RL. In an embodiment, the sensing thin film transistor T3 may be controlled by the scan line SL instead of the sensing control line SSL.

The sensing thin film transistor T3 may sense an electric potential of an anode electrode of the organic light-emitting diode OLED. The sensing thin film transistor T3 supplies a pre-charging voltage from the reference voltage line RL to the second node S, or supplies a voltage of the anode electrode AD of the organic light-emitting diode OLED to the reference voltage line RL during a sensing period in response to a sensing signal SSn from the sensing control line SSL.

The first electrode CE1 of the storage capacitor Cst is connected to the first node N, and the second electrode CE2 of the storage capacitor Cst is connected to the second node S. The storage capacitor Cst is charged with a voltage corresponding to a voltage difference between voltages respectively supplied to the first node N and the second node S, and the storage capacitor Cst supplies the charged voltage as a driving voltage of the driving thin film transistor T1. In one embodiment, for example, the storage capacitor Cst may be charged with a difference voltage between a data voltage Dm and a pre-charging voltage Vpre respectively supplied to the first node N and the second node S.

A bias electrode BSM may correspond to the driving thin film transistor T1 and connected to the source electrode S3 of the sensing thin film transistor T3. Since the bias electrode BSM receives a voltage in cooperation with an electric potential of the source electrode S3 of the sensing thin film transistor T3, the driving thin film transistor T1 may be stabilized. In an embodiment, the bias electrode BSM is not connected to the source electrode S3 of the sensing thin film transistor T3 and may be connected to a separate bias wiring.

An opposite electrode (e.g. a cathode) of the organic light-emitting diode OLED receives a common power voltage ELVSS. The organic light-emitting diode OLED receives a driving current from the driving thin film transistor T1, thereby emitting light.

FIG. 2C shows an embodiment where the signal lines SL, SSL, and DL, the reference voltage line RL, the first power line PL1 and the second power line PL2 are provided for each pixel PX, but embodiments are not limited thereto. In one alternative embodiment, for example, at least one of the signal lines SL, SSL, and DL, the reference voltage line RL, the first power line PL1, and the second power line PL2 may be shared by neighboring pixels.

Figure 3:
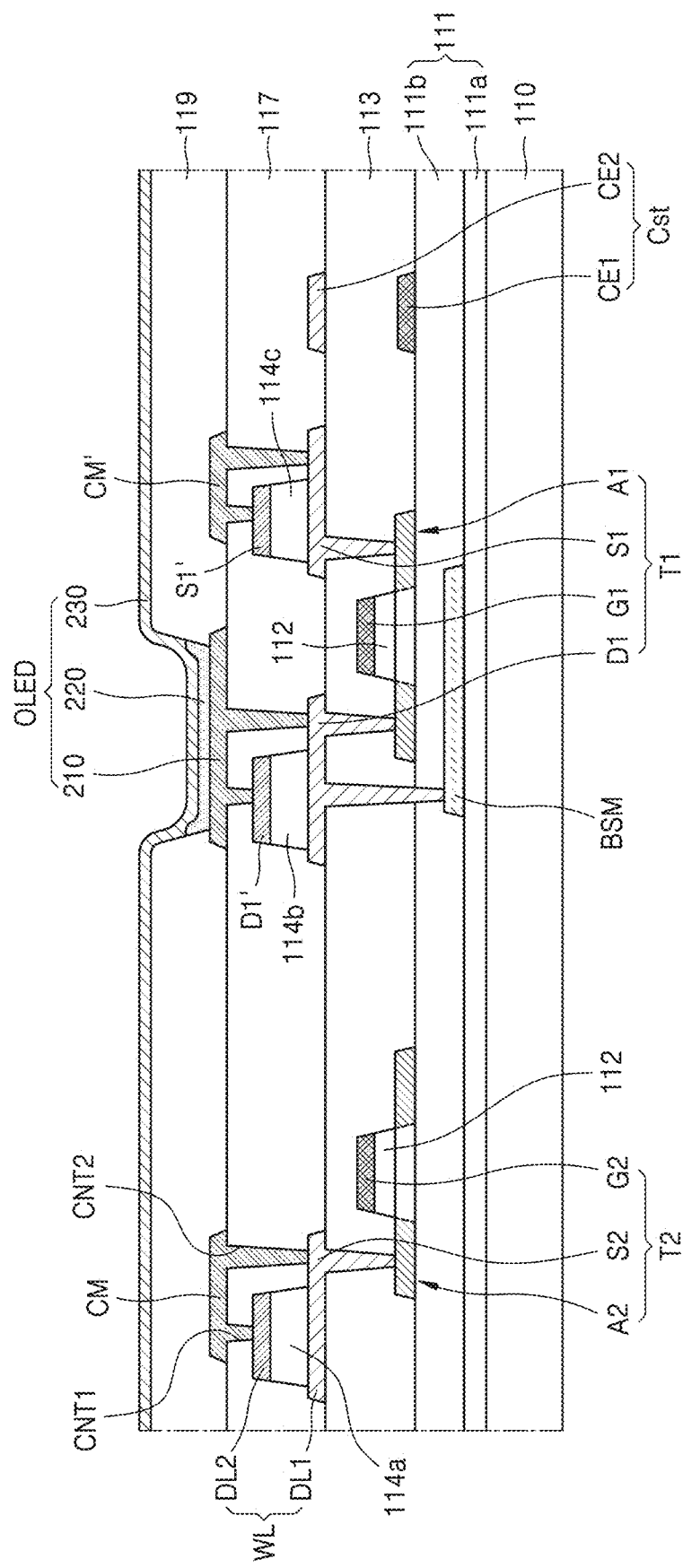
FIG. 3 is a cross-sectional view of a display device according to an embodiment.

FIG. 3 is a cross-sectional view of a display device according to an embodiment.

Referring to FIG. 3, an embodiment of the display may include a first thin film transistor T1, a second thin film transistor T2, an organic light-emitting diode OLED, which is a display element, a wiring WL including a first wiring layer DL1 and a second wiring layer DL2, a first pattern insulating layer 114a, a planarization layer 117 and a connection electrode CM, which are over a substrate 110.

The first thin film transistor T1 may be connected to the organic light-emitting diode OLED and may serve as a driving thin film transistor. The second thin film transistor T2 may be connected to the wiring WL such as a data line and may serve as a switching thin film transistor.

The first thin film transistor T1 may include a first semiconductor layer A1, a first gate electrode G1, a first drain electrode D1, and a first source electrode S1. The second thin film transistor T2 may include a second semiconductor layer A2, a second gate electrode G2, a second drain electrode, and a second source electrode S2.

In an embodiment, as shown in FIG. 3, the wiring WL includes the first wiring layer DL1 and the second wiring layer DL2, such that an electric resistance of the wiring WL may be reduced. Therefore, in such an embodiment, the display device may be driven at high speed.

The first pattern insulating layer 114a may be arranged between the first wiring layer DL1 and the second wiring layer DL2 of the wiring WL. The first pattern insulating layer 114a may be simultaneously formed during a process of forming the second wiring layer DL2. Therefore, an area of a bottom surface of the second wiring layer DL2 may be substantially the same as an area of a top surface of the first pattern insulating layer 114a. In such an embodiment, a lateral surface of the second wiring layer DL2 may be connected to a lateral surface of the first pattern insulating layer 114a, that is, the lateral surface of the second wiring layer DL2 and the lateral surface of the first pattern insulating layer 114a may collectively define a same lateral surface.

In an embodiment, where the first pattern insulating layer 114a is arranged between the first wiring layer DL1 and the second wiring layer DL2, a connection electrode CM may be arranged to connect the first wiring layer DL1 to the second wiring layer DL2. The connection electrode CM may include a same material as a material of a pixel electrode 210 of the organic light-emitting diode OLED described below and may be arranged directly on a same layer on which the pixel electrode 210 is arranged or the connection electrode CM may be disposed in a same layer as the pixel electrode 210.

The connection electrode CM may be arranged on a layer different from a layer on which the first wiring layer DL1 and the second wiring layer DL2 are arranged, or the connection electrode CM may be disposed in a different layer from the first wiring layer DL1 and the second wiring layer DL2. Accordingly, the connection electrode CM may be connected to the first wiring layer DL1 through a first contact hole CNT1 defined in the planarization layer 117 and connected to the second wiring layer DL2 through a second contact hole CNT2 defined in the planarization layer 117. The first wiring layer DL1 and the second wiring layer DL2 are respectively connected to the connection electrode CM through the first contact hole CNT1 and the second contact hole CNT2. In such an embodiment, an area of the first wiring layer DL1 may be different from an area of the second wiring layer DL2 such that the contact holes, that is, the first contact hole CNT1 and the second contact hole CNT2 may be secured.

A stacked structure of an embodiment of a display device will hereinafter be described in detail with reference to FIG. 3.

In an embodiment, the substrate 110 may include a glass material, a ceramic material, a metal material, or a flexible or bendable material. In an embodiment where the substrate 110 includes a flexible or bendable material, the substrate 110 may include a polymer resin such as polyethersulfone ("PES"), polyarylate, polyetherimide ("PEI"), polyethylene naphthalate ("PEN"), polyethylene terephthalate ("PET"), polyphenylene sulfide ("PPS"), polyimide ("PI"), polycarbonate ("PC") or cellulose acetate propionate ("CAP"), for example. The substrate 110 may have a single or multi-layered structure, each layer including at least one selected from the above materials. In an embodiment, where the substrate 110 has a multi-layered structure, the substrate 110 may further include an inorganic layer. In an embodiment, the substrate 110 may have a structure of an organic material/an inorganic material/an organic material.

The buffer layer 111 is disposed over an entire top surface of the substrate 110 and may have a structure in which a first buffer layer 111a and a second buffer layer 111b are stacked one on another. The buffer layer 111 may increase flatness of a top surface of the substrate 110 and include an inorganic material such as silicon oxide, silicon nitride, and/or silicon oxynitride. In an embodiment, the buffer layer 111 may serve as a barrier layer. The buffer layer 111 may effectively prevent or minimize penetration of impurities from the substrate 110, etc. into the first and second semiconductor layers A1 and A2. The first buffer layer 111a may include a material that is the same as or different from a material of the second buffer layer 111b. In an embodiment, each of the first buffer layer 111a and the second buffer layer 111b may have a single or multi-layered structure.

The bias electrode BSM may be arranged between the first buffer layer 111a and the second buffer layer 111b. The bias electrode BSM may be arranged to overlap at least a portion of the first thin film transistor T1 and may be connected to the first drain electrode D1 of the first thin film transistor T1. In such an embodiment, the bias electrode BSM receives a voltage of an electric potential of the first drain electrode D1 of the first thin film transistor T1, such that the driving thin film transistor T1 may be stabilized. In an alternative embodiment, the bias electrode BSM may not be connected to the first drain electrode D1 of the first thin film transistor T1 and may be connected to a separate bias wiring.

The first and second semiconductor layers A1 and A2 may be arranged on the buffer layer 111. The first and second semiconductor layers A1 and A2 may include amorphous silicon or polycrystalline silicon. In an alternative embodiment, the first and second semiconductor layers A1 and A2 may include an oxide of at least one selected from In, Ga, Sn, Zr, V, Hf, Cd, Ge, Cr, Ti and Zn. The first and second semiconductor layers A1 and A2 may include a channel region, a source region and a drain region, and the source region and the drain region may be doped with impurities.

The first and second gate electrodes G1 and G2 are arranged over the first and second semiconductor layers A1 and A2 with a gate insulating layer 112 therebetween. The first and second gate electrodes G1 and G2 may include at least one selected from Mo, Al, Cu and Ti, and may have a single or multi-layered structure. In one embodiment, for example, the first and second gate electrodes G1 and G2 may include a single Mo layer.

The gate insulating layer 112 may include $SiO_2$, $SiN_x$, SiON, $Al_2O_3$, $TiO_2$, $Ta_2O_5$, $HfO_2$, or $ZnO_2$.

In an embodiment, as shown in FIG. 3, the gate insulating layer 112 may be patterned in a same shape as those of the first gate electrode G1 and the second gate electrode G2. However, embodiments are not limited thereto. Alternatively, the gate insulating layer 112 may be disposed over an entire top surface of the substrate 110.

In an embodiment where the gate insulating layer 112 is patterned as shown in FIG. 3, the first electrode CE1 of the storage capacitor Cst may be arranged on a top surface of the buffer layer 111. The first electrode CE1 may include a same material as those of the first and second gate electrodes G1 and G2 and may be formed during a same process as a process of forming the first and second gate electrodes G1 and G2. The first electrode CE1 may include at least one selected from Mo, Al, Cu and Ti, and may have a single or multi-layered structure.

A first interlayer insulating layer 113 may cover the first and second gate electrodes G1 and G2, and the first electrode CE1. The first interlayer insulating layer 113 may include $SiO_2$, $SiN_x$, SiON, $Al_2O_3$, $TiO_2$, $Ta_2O_5$, $HfO_2$, or $ZnO_2$.

The first and second source electrodes S1 and S2 respectively of the first and second thin film transistors T1 and T2, the first drain electrode D1, the first wiring layer DL1, and the second electrode CE2 of the storage capacitor Cst may be arranged on the first interlayer insulating layer 113.

In an embodiment, the second electrode CE2 of the storage capacitor Cst overlaps the first electrode CE1 and the first interlayer insulating layer 113 is disposed therebetween. In such an embodiment, the first interlayer insulating layer 113 may serve as a dielectric layer of the storage capacitor Cst.

The first and second source electrodes S1 and S2, the first drain electrode D1, the first wiring layer DL1, and the second electrode CE2 of the storage capacitor Cst may include a conductive material including at least one selected from Mo, Al, Cu and Ti, and may have a single or multi-layered structure, each layer including at least one selected from the above materials. In an embodiment, the first and second source electrodes S1 and S2, the first drain electrode D1, the first wiring layer DL1, and the second electrode CE2 of the storage capacitor Cst may have a multi-layered structure of Ti/Al/Ti.

The first and second source electrodes S1 and S2 and the first drain electrode D1 may be connected to the first and second semiconductor layers A1 and A2 through contact holes defined through the first interlayer insulating layer 113. A portion of the first wiring layer DL1 of the wiring WL may extend to serve as the second source electrode S2. In such an embodiment, the first wiring layer DL1 and the second source electrode S2 may define, or be integrally formed as, a single unitary body.

Pattern insulating layers 114a, 114b, and 114c may be arranged on the first and second source electrodes S1 and S2, the first drain electrode D1, and the first wiring layer DL1. The pattern insulating layers 114a, 114b, and 114c may include $SiO_2$, $SiN_x$, SiON, $Al_2O_3$, $TiO_2$, $Ta_2O_5$, $HfO_2$, or $ZnO_2$.

The pattern insulating layers 114a, 114b, and 114c may include a first pattern insulating layer 114a, a second pattern insulating layer 114b, and a third pattern insulating layer 114c. The first pattern insulating layer 114a may be arranged to correspond to the first wiring layer DL1 and may expose a portion of the first wiring layer DL1. The second pattern insulating layer 114b may be arranged to correspond to the first drain electrode D1 and may expose a portion of the first drain electrode D1. The third pattern insulating layer 114c may be arranged to correspond to the first source electrode S1 and may expose a portion of the first source electrode S1.

The second wiring layer DL2, a first additional drain electrode D1', and a second additional source electrode S1' may be arranged on the pattern insulating layers 114a, 114b, and 114c. The second wiring layer DL2, the first additional drain electrode D1, and the second additional source electrode S1' may include a conductive material including at least one selected from Mo, Al, Cu and Ti, and may have a single or multi-layered structure, each layer including at least one selected from the above materials. In one embodiment, for example, the second wiring layer DL2, the first additional drain electrode D1, and the second additional source electrode S1' may have a multi-layered structure of Ti/Al/Ti.

The pattern insulating layers 114a, 114b, and 114c may be formed by etching during a same process as a process of forming the second wiring layer DL2, the first additional drain electrode D1, and the second additional source electrode S1' arranged thereon.

The planarization layer 117 covers the second wiring layer DL2, the first additional drain electrode D1, and the second additional source electrode S1'. The planarization layer 117 may include an organic material such as acryl, benzocyclobutene ("BCB"), PI, or hexamethyldisiloxane ("HMDSO"). Alternatively, the planarization layer 117 may include an inorganic material. The planarization layer 117 may generally planarize a protective layer covering the first and second thin film transistors T1 and T2 and the wiring WL. The planarization layer 117 may have a single or multi-layered structure. in an embodiment, where the pattern insulating layers 114a, 114b, and 114c are patterned, the planarization layer 117 may contact lateral surfaces of the pattern insulating layers 114a, 114b, and 114c.

The connection electrode CM, the pixel electrode 210, and a source connection electrode CM' may be arranged on the planarization layer 117. The connection electrode CM may be connected to the first wiring layer DL1 and the second wiring layer DL2 respectively through the first contact hole CNT1 and the second contact hole CNT2 defined in the planarization layer 117. The pixel electrode 210 may be one electrode of the organic light-emitting diode OLED and serve as a drain connection electrode connecting the first drain electrode D1 to the first additional drain electrode D1'. The pixel electrode 210 may be connected to the first drain electrode D1 and the first additional drain electrode D1 through contact holes defined in the planarization layer 117. In such an embodiment, the source connection electrode CM' may connect the first source electrode S1 to the first additional source electrode S1' through a contact hole defined in the planarization layer 117.

The connection electrode CM, the pixel electrode 210, and the source connection electrode CM' each may include a (semi) transmissive electrode or a reflective electrode. In an embodiment, the connection electrode CM, the pixel electrode 210, and the source connection electrode CM' may include a reflective layer and a transparent or semi-transparent electrode layer on the reflective layer, and the reflective layer may include at least one selected from Ag, Mg, Al, Pt, Pd, Au, Ni, Nd, Ir, Cr and a compound thereof. The transparent or semi-transparent electrode layer may include at least one selected from indium tin oxide ("ITO"), indium zinc oxide ("IZO"), zinc oxide (ZnO), or indium oxide ($In_2O_3$), indium gallium oxide ("IGO"), and aluminum zinc oxide ("AZO"). In an embodiment, the connection electrode CM, the pixel electrode 210, and the source connection electrode CM' may have a stacked structure of ITO/Ag/ITO.

A pixel-defining layer 119 may be arranged on the connection electrode CM, the pixel electrode 210, and the source connection electrode CM'. The pixel-defining layer 119 defines a pixel by an opening defined therethrough to correspond to each sub-pixel, that is, an opening that exposes at least a central portion of the pixel electrode 210. In an embodiment, the pixel-defining layer 119 may prevent an arc, etc. from occurring at edges of the pixel electrode 210 by increasing a distance between the edges of the pixel electrode 210 and an opposite electrode 230 over the edges of the pixel electrode 210. The pixel-defining layer 119 may include an organic material such as PI or HMDSO.

An intermediate layer 220 of the organic light-emitting diode OLED may include a low molecular weight material or a polymer material. In an embodiment where the intermediate layer 220 includes a low molecular weight material, the intermediate layer 220 may have a structure in which a hole injection layer ("HIL"), a hole transport layer ("HTL"), an emission layer ("EML"), an electron transport layer ("ETL"), an electron injection layer ("EIL"), etc. are stacked in a single or a composite configuration. The intermediate layer 220 may include at least one selected from various organic materials such as copper phthalocyanine ("CuPc"), N, N'-Di (naphthalene-1-yl)-N,N'-diphenyl-benzidine ("NPB"), and tris-8-hydroxyquinoline aluminum ("Alq3"). These layers may be formed by a vacuum deposition.

In an embodiment where the intermediate layer 220 includes a polymer material, the intermediate layer 220 may have a structure generally including an HTL and an EML. In such an embodiment, the HTL may include poly(3,4-ethylenedioxythiophene) polystyrene sulfonate ("PEDOT"), and the EML may include a polymer material such as a polyphenylene vinylene ("PPV")-based material and a polyfluorene-based material. The intermediate layer 220 may be formed by a screen printing, an inkjet printing or a laser induced thermal imaging ("LITI"), for example.

In an embodiment, the structure of the intermediate layer 220 is not limited those described above, but may be variously modified. In an embodiment, the intermediate layer 220 may include a layer which is a single unit over a plurality of pixel electrodes 210, or include a patterned layer corresponding to each of the plurality of pixel electrodes 210.

The opposite electrode 230 may be integrally formed as a single unitary indivisible unit over a plurality of organic light-emitting diodes and may correspond to a plurality of pixel electrodes 210. The opposite electrode 230 may include a conductive material having a low work function. In one embodiment, for example, the opposite electrode 230 may include a (semi) transparent layer including Ag, Mg, Al, Pt, Pd, Au, Ni, Nd, Ir, Cr, Li, Ca, or an alloy thereof. Alternatively, the opposite electrode 230 may further include a layer including ITO, IZO, ZnO, or $In_2O_3$ on the (semi) transparent layer including at least one selected from the above material.

FIGS. 4 to 11 are sequential cross-sectional views of a method of manufacturing a display device, according to an embodiment.

Figure 4:
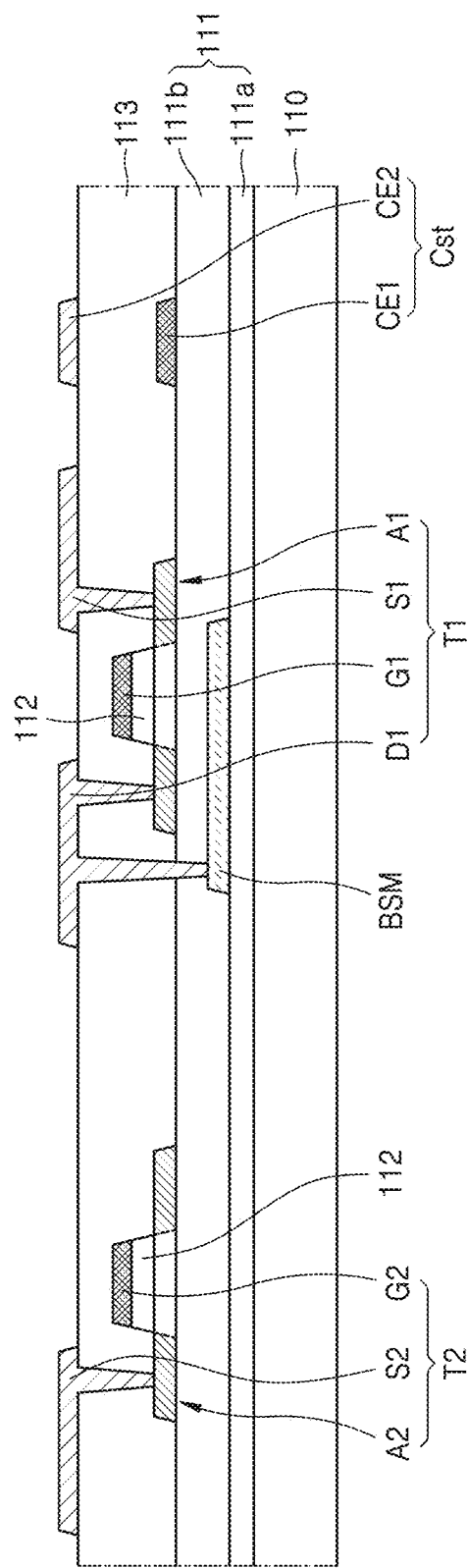
FIGS. 4 to 11 are sequential cross-sectional views of a method of manufacturing a display device according to an embodiment.
Figure 5:
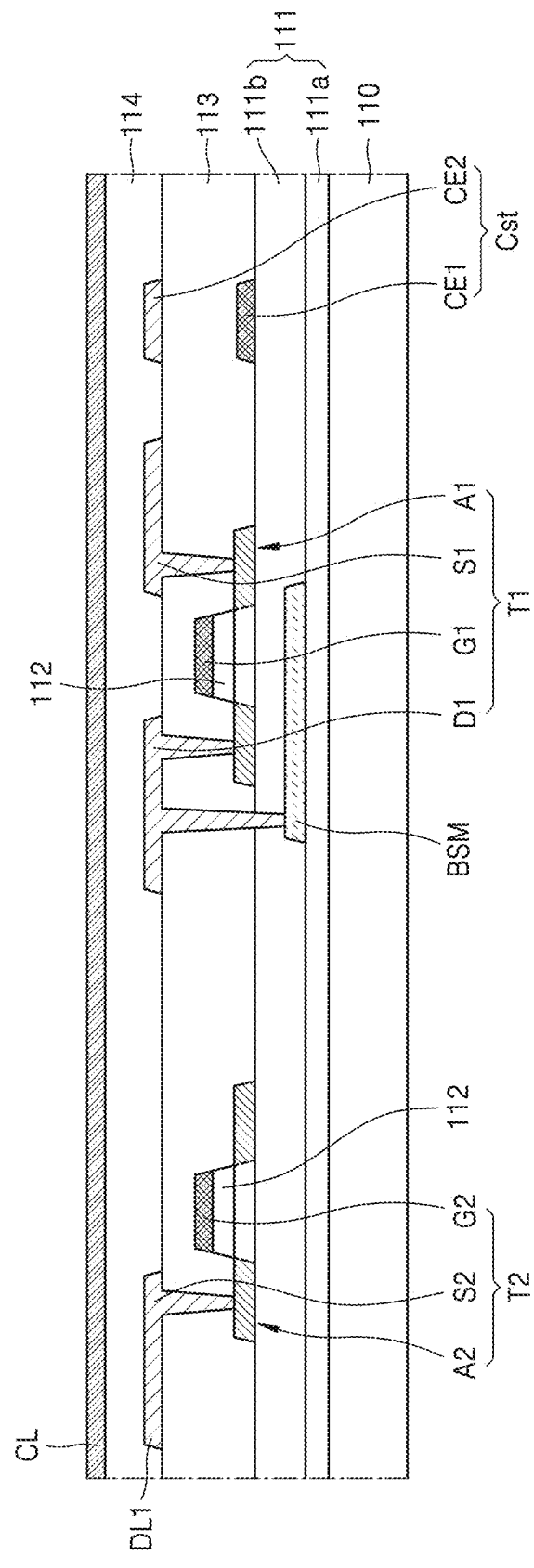

In an embodiment, referring to FIG. 4, the first thin film transistor T1, the second thin film transistor T2 and the storage capacitor Cst are provided or formed over the substrate 110. The first electrode CE1 of the storage capacitor Cst may be simultaneously formed with the first and second gate electrodes G1 and G2 during the same process as a process of forming the first and second gate electrodes G1 and G2 of the first and second thin film transistors T1 and T2. The second electrode CE2 of the storage capacitor Cst may be simultaneously formed with the first wiring layer DL1, the first and second source electrodes S1 and S2, and the first drain electrode D1 during the same process as a process of forming the first wiring layer DL1, the first and second source electrodes S1 and S2, and the first drain electrode D1. In such an embodiment, as described above, since a separate process is not performed to form the storage capacitor Cst in the display device, manufacturing costs and time may be reduced.

In an embodiment, a second interlayer insulating layer 114 is provided or formed on an entire top surface of the substrate 110 to cover the first and second source electrodes S1 and S2 of the first and second thin film transistors T1 and T2, the first drain electrode D1, the first wiring layer DL1, and the storage capacitor Cst.

The second interlayer insulating layer 114 may include $SiO_2$, $SiN_x$, $SiON$, $Al_2O_3$, $TiO_2$, $Ta_2O_5$, $HfO_2$, or $ZnO_2$. The second interlayer insulating layer 114 may be formed by using at least one of various deposition methods such as a chemical vapor deposition ("CVD") and a sputtering.

In such an embodiment, a conductive layer CL is provided or formed over an entire top surface of the second interlayer insulating layer 114. The conductive layer CL may include a conductive material including Mo, Al, Cu or Ti and have a single or multi-layered structure, including at least one selected from the above materials.

The conductive layer CL may be formed by a deposition method such as a plasma enhanced CVD ("PECVD"), a low pressure CVD ("LPCVD"), a physical vapor deposition ("PVD"), a sputtering or an atomic layer deposition ("ALD"), but not being limited thereto.

Figure 6:
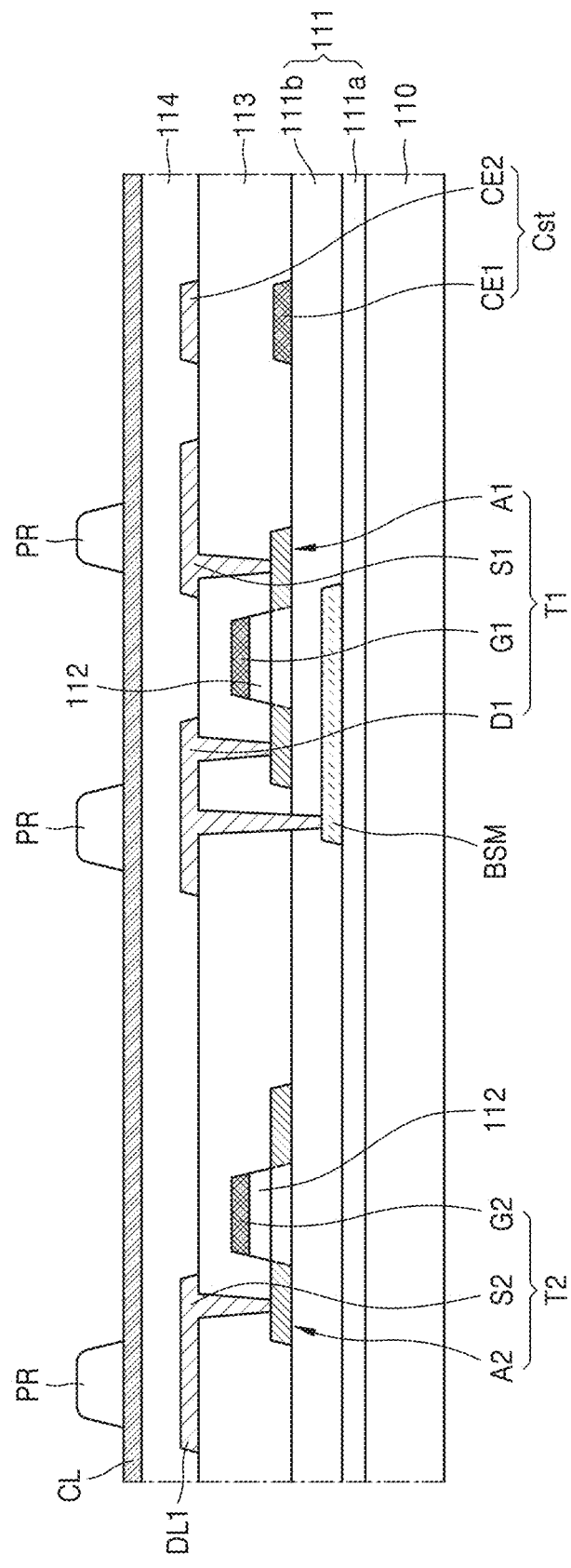

In such an embodiment, referring to FIG. 6, a photoresist ("PR") pattern is formed on the conductive layer CL through a photolithography process. The photolithography process includes coating a photosensitive material on the conductive layer CL, irradiating light on the photosensitive material by using a mask, and then forming a PR pattern through hardening and developing processes. The PR pattern may be formed to correspond to areas in which the second wiring layer DL2, the first additional drain electrode D1' and the first additional source electrode S1', which will be described below, are formed.

Figure 7:
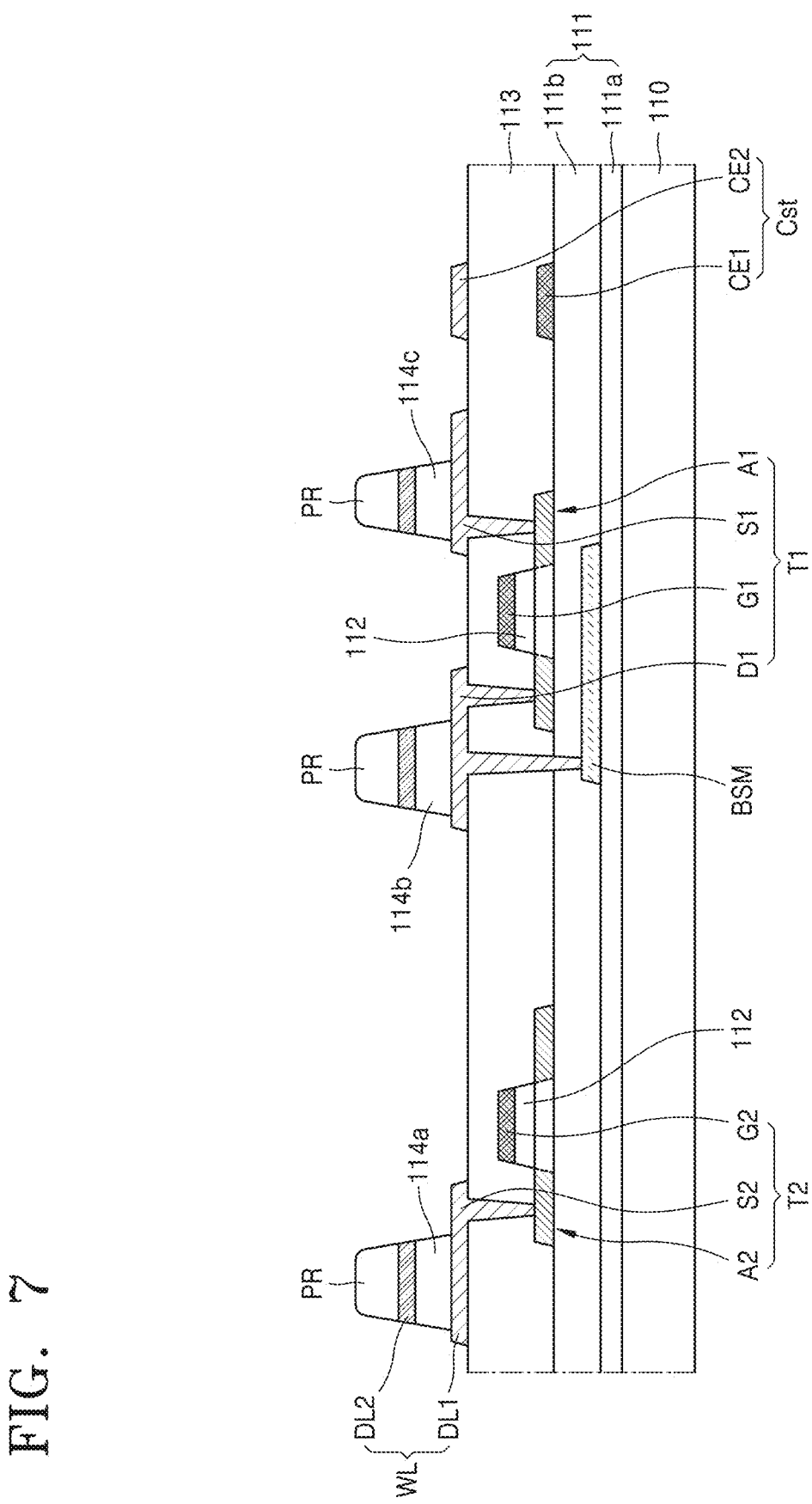

In an embodiment, referring to FIG. 7, a process of etching the conductive layer CL and the second interlayer insulating layer 114 by using the PR pattern as an etch mask is performed. In such an embodiment, the second wiring layer DL2, the first additional drain electrode D1 and the first additional source electrode S1' may be formed by etching the conductive layer CL. In an embodiment, a first pattern insulating layer 114a, a second pattern insulating layer 114b and a third pattern insulating layer 114c may be formed using the PR pattern, the second wiring layer DL2, the first additional drain electrode D1 and the first additional source electrode S1' as etch masks for the second interlayer insulating layer 114.

The conductive layer CL and the second interlayer insulating layer 114 may be sequentially etched, and etching conditions thereof may be different from each other. The etching may be performed by a dry etching, a wet etching or a combination thereof. In such an embodiment, as described above, the process of etching the second interlayer insulating layer 114 may be performed without a separate mask process, such that manufacturing costs and time may be reduced during a process.

Figure 8:
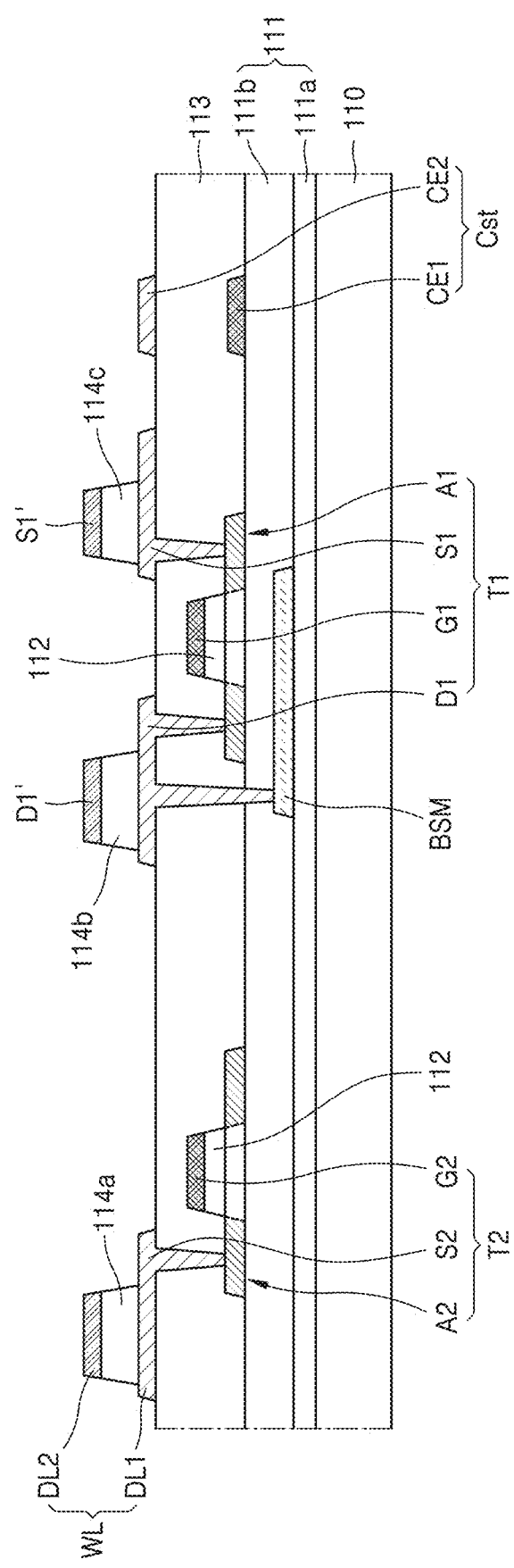
Figure 9:
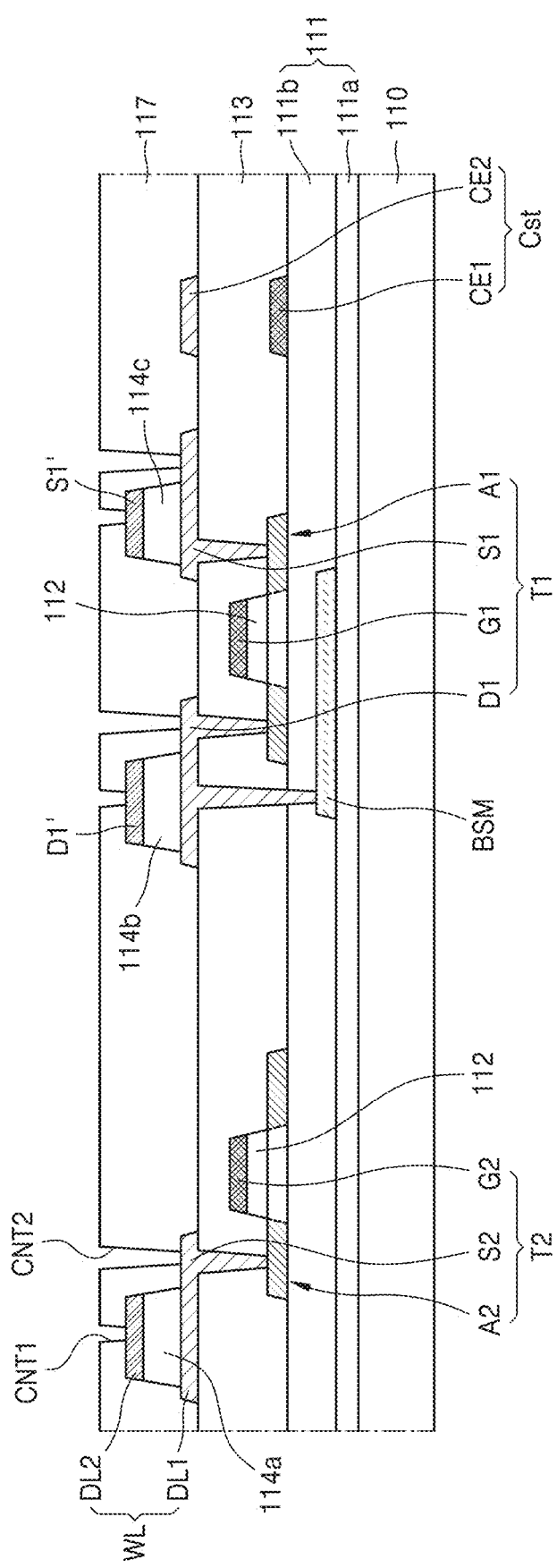

In an embodiment, referring to FIGS. 8 and 9, the PR pattern used as an etch mask is removed, and the planarization layer 117 is provided or formed on an entire top surface of the first interlayer insulating layer 113 to cover the second wiring layer DL2, the first additional drain electrode D1 and the first additional source electrode S1'.

In an embodiment, an organic material such as acryl, BCB, PI or HMDSO is coated on the entire top surface of the first interlayer insulating layer 113 to cover the second wiring layer DL2, the first additional drain electrode D1 and the first additional source electrode S1', and contact holes such as the first contact hole CNT1 and the second contact hole CNT2 may be formed through a mask process to form the planarization layer 117. In such an embodiment, the holes expose the second wiring layer DL2, the first additional drain electrode D1, the first additional source electrode S1', the first wiring layer DL1, the first drain electrode D1 and the first source electrode S1.

Figure 10:
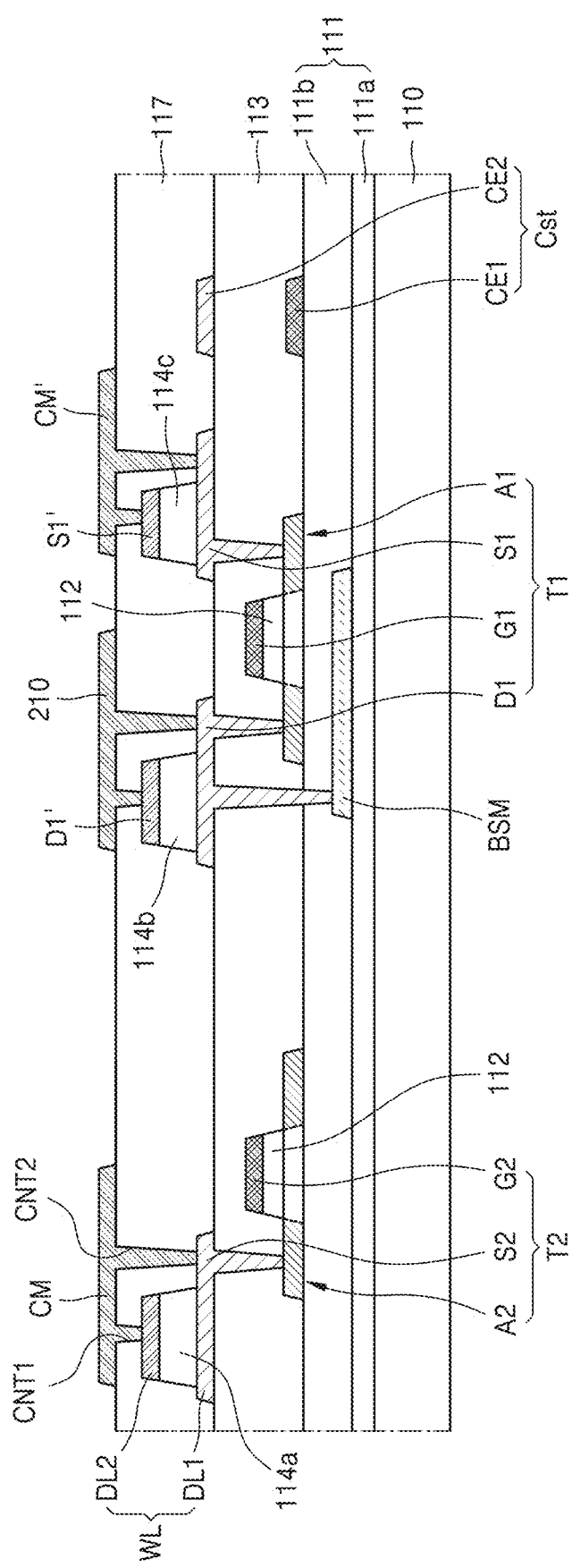

In an embodiment, referring to FIG. 10, the connection electrode CM, the pixel electrode 210 and the source connection electrode CM' are provided or formed on the planarization layer 117. The connection electrode CM, the pixel electrode 210 and the source connection electrode CM' may be formed by depositing a conductive layer on an entire top surface of the planarization layer 117 and performing a mask process and an etching process.

In such an embodiment, holes exposing the second wiring layer DL2, the first additional drain electrode D1, the first additional source electrode S1', the first wiring layer DL1, the first drain electrode D1 and the first source electrode S1 are formed in the planarization layer 117, such that the connection electrode CM may connect the first wiring layer DL1 to the second wiring layer DL2 through the holes. In such an embodiment, the pixel electrode 210 may connect the first drain electrode D1 to the first additional drain electrode D1, and the source connection electrode CM' may connect the first source electrode S1 to the first additional source electrode S1'.

Figure 11:
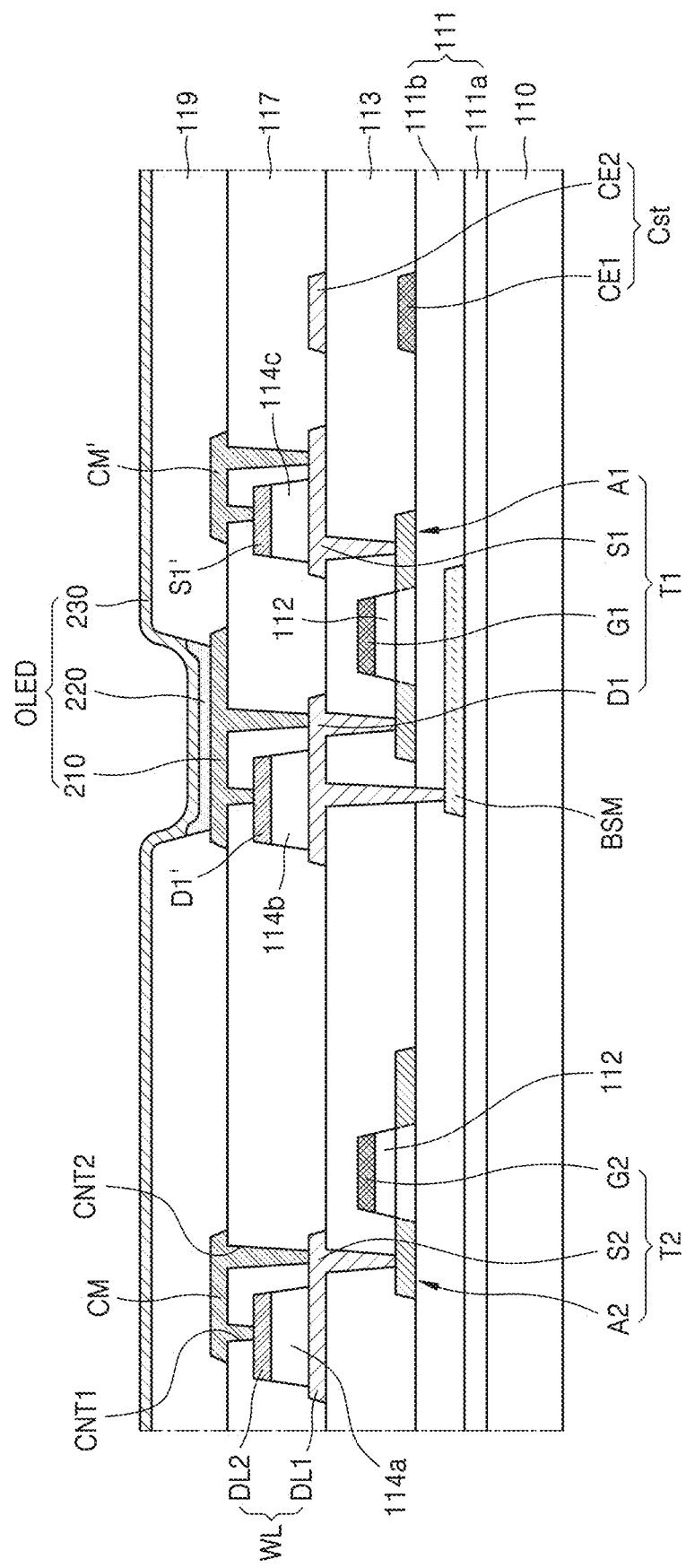

In an embodiment, referring to FIG. 11, the pixel-defining layer 119 is provided or formed on an entire top surface of the planarization layer 117 to cover edges of the pixel electrode 210, and an opening that exposes a central portion of the pixel electrode 210 is formed through the pixel-defining layer 119. The intermediate layer 220 is provided or formed inside the opening. The intermediate layer 220 may include a low molecular weight material or a polymer material. The intermediate layer 220 may be formed by a vacuum deposition method, a screen printing, an inkjet printing or an LITI.

In an embodiment, as shown in FIG. 11, the opposite electrode 230 is provided or formed to correspond to a plurality of organic light-emitting diodes OLED. The opposite electrode 230 may be formed by using an open mask to cover the display area DA (see FIG. 1) of the substrate 110. The opposite electrode 230 may be formed by at least one of deposition methods such as PECVD, LPCVD, PVD, a sputtering and an ALD.

Figure 12:
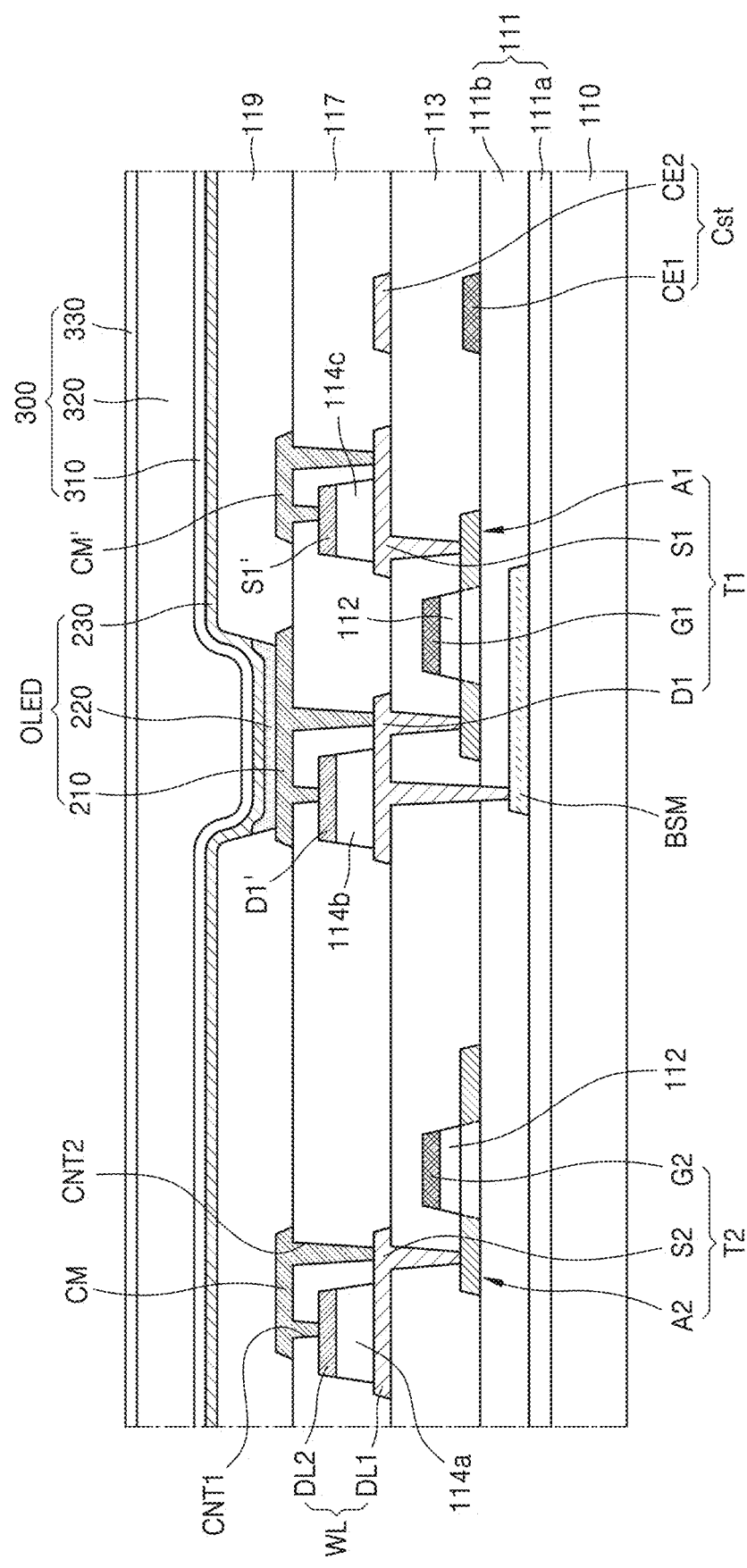
FIG. 12 is a cross-sectional view of a display device according to an alternative embodiment.

FIG. 12 is a cross-sectional view of a display device according to an alternative embodiment. In FIG. 12, the same or like elements have been labeled with the same reference characters as used above to describe embodiments in FIG. 3, and any repetitive detailed description thereof will hereinafter be omitted or simplified.

Referring to FIG. 12, an embodiment of the display device includes the first and second thin film transistors T1 and T2, an organic light-emitting diode OLED, which is a display element connected to the first thin film transistor T1, the wiring WL connected to the second thin film transistor T2 and including the first wiring layer DL1 and the second wiring layer DL2, the first pattern insulating layer 114a arranged between the first wiring layer DL1 and the second wiring layer DL2, the planarization layer 117 covering the wiring WL, and the connection electrode CM arranged on the planarization layer 117 and connected to the first wiring layer DL1 and the second wiring layer DL2 respectively through the first contact hole CNT1 and the second contact hole CNT2.

In such an embodiment, the wiring WL includes the first wiring layer DL1 and the second wiring layer DL2, such that an electric resistance of the wiring WL is reduced and thus a high-speed driving may be effectively realized.

In an embodiment, as shown in FIG. 12, a thin-film encapsulation layer 300 may be disposed on the organic light-emitting diode OLED. In such an embodiment, the thin-film encapsulation layer 300 may protect the organic light-emitting diodes OLED, which may be easily damaged by external moisture or oxygen, by covering the organic light-emitting diodes OLED. The thin-film encapsulation layer 300 may cover the display area DA (see FIG. 1) and extend to the peripheral area PA (see FIG. 1) outside the display area DA. The thin-film encapsulation layer 300 may include a first inorganic encapsulation layer 310, an organic encapsulation layer 320, and a second inorganic encapsulation layer 330.

The first inorganic encapsulation layer 310 may cover the opposite electrode 230 and include a ceramic, a metal oxide, a metal nitride, a metal carbide, a metal oxynitride, indium oxide ($In_2O_3$), zinc oxide ($SnO_2$), ITO, silicon oxide, silicon nitride, and/or silicon oxynitride. Alternatively, other layers such as a capping layer may be arranged between the first inorganic encapsulation layer 310 and the opposite electrode 230. Since the first inorganic encapsulation layer 310 is disposed or formed along a structure thereunder, a top surface of the first inorganic encapsulation layer 310 may not be flat.

The organic encapsulation layer 320 covers the first inorganic encapsulation layer 310. In an embodiment, a top surface of the organic encapsulation layer 320 may be approximately flat. In such an embodiment, a top surface of the organic encapsulation layer 320 that corresponds to the display area DA may be approximately flat. The organic encapsulation layer 320 may include at least one of acrylic, met acrylic, polyester, polyethylene, polypropylene, PET, PEN, PC, PI, polyethylene sulfonate, polyoxymethylene, polyarylate, and HMDSO.

The second inorganic encapsulation layer 330 may cover the organic encapsulation layer 320 and include a ceramic, a metal oxide, a metal nitride, a metal carbide, a metal oxynitride, indium oxide ($In_2O_3$), zinc oxide ($SnO_2$), ITO, silicon oxide, silicon nitride, and/or silicon oxynitride.

Since the thin-film encapsulation layer 300 includes the first inorganic encapsulation layer 310, the organic encapsulation layer 320, and the second inorganic encapsulation layer 330 as described above, even when a crack occurs inside the thin-film encapsulation layer 300, the thin-film encapsulation layer 300 may effectively prevent cracks from being connected to each other through such a multi-layered structure, the cracks occurring between the first inorganic encapsulation layer 310 and the organic encapsulation layer 320 or between the organic encapsulation layer 320 and the second inorganic encapsulation layer 330. In such an embodiment, forming of a path through which external moisture or oxygen may penetrate into the display area DA may be effectively prevented or minimized.

In an embodiment, a spacer (not shown) for preventing mask chopping may be further provided on the pixel-defining layer 119. In an embodiment, at least one of various functional layers including a polarization layer for reducing external light reflection, a black matrix, a color filter and/or a touchscreen layer including a touch electrode may be provided on the thin-film encapsulation layer 300.

Figure 13:
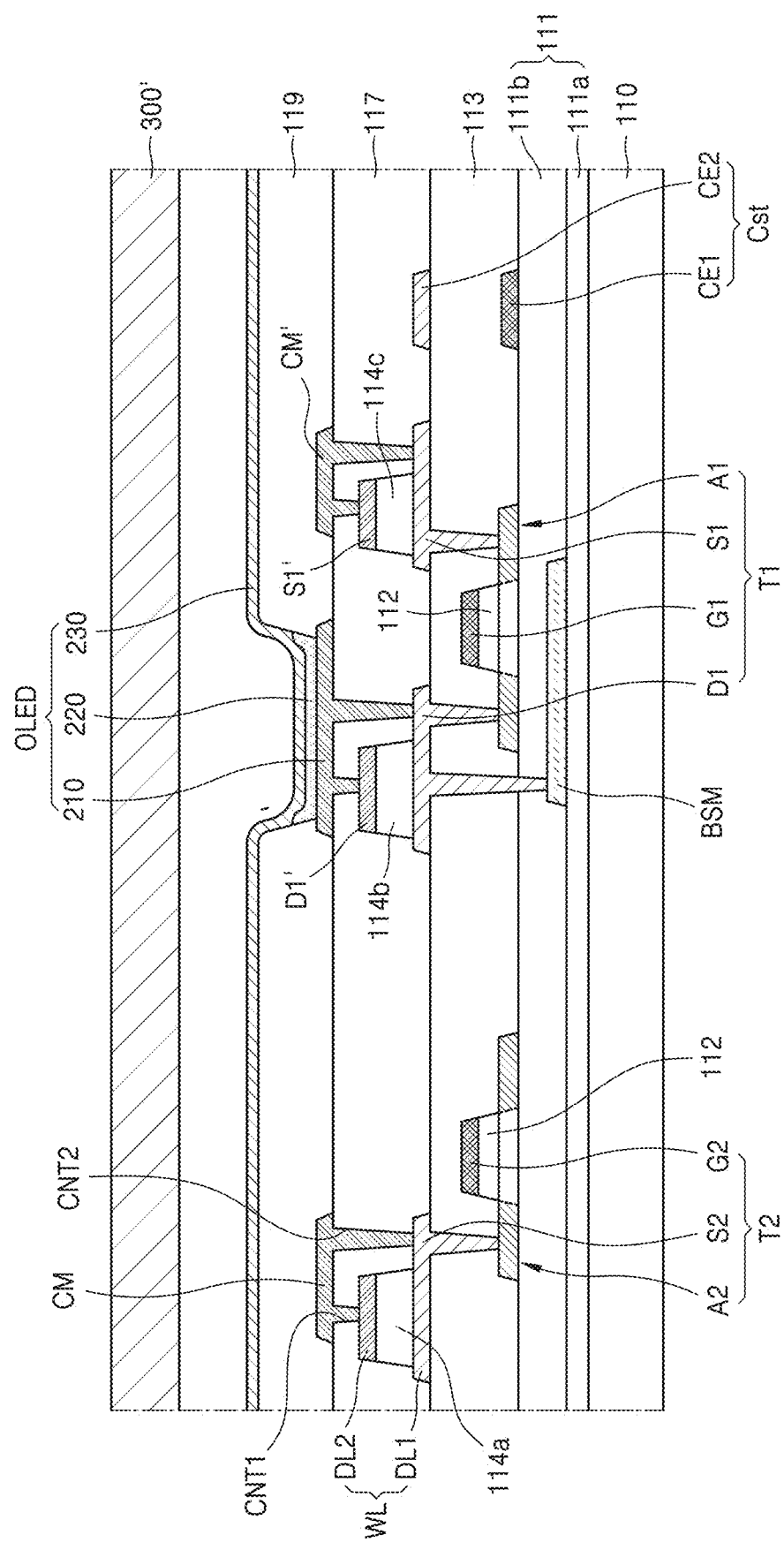
FIG. 13 is a cross-sectional view of a display device according to another alternative embodiment.

FIG. 13 is a cross-sectional view of a display device according to another alternative embodiment. In FIG. 13, the same or like elements have been labeled with the same reference characters as used above to describe embodiments in FIG. 3, and any repetitive detailed description thereof will hereinafter be omitted or simplified.

Referring to FIG. 13, an embodiment of the display device includes the first and second thin film transistors T1 and T2, an organic light-emitting diode OLED, which is a display element connected to the first thin film transistor T1, the wiring WL connected to the second thin film transistor T2 and including the first wiring layer DL1 and the second wiring layer DL2, the first pattern insulating layer 114a arranged between the first wiring layer DL1 and the second wiring layer DL2, the planarization layer 117 covering the wiring WL, and the connection electrode CM arranged on the planarization layer 117 and connected to the first wiring layer DL1 and the second wiring layer DL2 respectively through the first contact hole CNT1 and the second contact hole CNT2.

In such an embodiment, the wiring WL includes the first wiring layer DL1 and the second wiring layer DL2, such that an electric resistance of the wiring WL is reduced and thus a high-speed driving is effectively realized.

In an embodiment, as shown in FIG. 13, a sealing substrate 300' facing the substrate 110 may be further provided, where the sealing substrate 300' seals the organic light-emitting diode OLED. In such an embodiment, the organic light-emitting diode OLED may be arranged between the substrate 110 and the sealing substrate 300'. The sealing substrate 300' may include a glass or a polymer resin. The substrate 110 and the sealing substrate 300' may be attached to each other by a sealing material such as sealant or frit, and the sealing material is arranged in the peripheral area PA (see FIG. 1) and at least partially surrounds the display area DA. In such an embodiment, at least one of various functional layers including a polarization layer for reducing external light reflection, a black matrix, a color filter, and/or a touchscreen layer including a touch electrode may be provided on the sealing substrate 300'.

In embodiments of the invention, as described above, since a data line for providing a data signal, etc. are provided by using the first wiring layer and the second wiring layer in a display device, low-resistance wirings may be implemented and thus high-speed driving is realized.

In embodiments of the invention, since a method of manufacturing a display device is performed with a minimized number of mask process, such that process time and costs may be reduced.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of manufacturing a display device, the method comprising:
   providing a thin film transistor and a first wiring layer connected to the thin film transistor over a substrate;
   sequentially providing an insulating layer and a conductive layer on an entire top surface of the substrate to cover the first wiring layer;
   providing a photoresist pattern on the conductive layer;
   forming a second wiring layer and a pattern insulating layer by etching the conductive layer and the insulating layer using the photoresist pattern as an etch mask, the first wiring layer overlapping the second wiring layer in a thickness direction of the substrate; and
   providing a connection electrode connecting the first wiring layer to the second wiring layer.

2. The method of claim 1, wherein
   a bottom surface of the second wiring layer has a same area as an area of a top surface of the pattern insulating layer.

3. The method of claim 1, wherein
   a lateral surface of the second wiring layer is connected to a lateral surface of the pattern insulating layer.

4. The method of claim 1, wherein
   a display element of the display device includes a pixel electrode, an emission layer, and an opposite electrode, and
   the connection electrode includes a same material as a material of the pixel electrode and is disposed in a same layer as the pixel electrode.

5. The method of claim 1, wherein
   an area of the first wiring layer is different from an area of the second wiring layer.

6. The method of claim 1, further comprising:
   providing a planarization layer covering the first wiring layer, the second wiring layer and the pattern insulating layer before the providing the connection electrode.

7. The method of claim 1, further comprising:
   providing a capacitor including a first electrode and a second electrode,
   wherein the first electrode includes a same material as a material of a gate electrode of the thin film transistor, and
   the second electrode overlaps the first electrode, includes a same material as a material of the first wiring layer, and is disposed in a same layer as the first wiring layer.

8. The method of claim 1, further comprising:
   providing a bias electrode arranged below the thin film transistor.

* * * * *